(12) United States Patent
Maheshwari et al.

(10) Patent No.: US 10,425,083 B1
(45) Date of Patent: Sep. 24, 2019

(54) DIVIDER CIRCUIT

(71) Applicant: Dialog Semiconductor B.V., s-Hertogenbosch (NL)

(72) Inventors: Vaibhav Maheshwari, Den Bosch (NL); Michail Papamichail, Eindhoven (NL)

(73) Assignee: Dialog Semiconductor B.V., 'S-Hertogenbosch (NL)

( * ) Notice: Subject to any disclaimer, the term of this patent is extended or adjusted under 35 U.S.C. 154(b) by 0 days.

(21) Appl. No.: 16/040,842

(22) Filed: Jul. 20, 2018

(51) Int. Cl.
H03K 21/00 (2006.01)
H03K 23/00 (2006.01)
H03K 21/08 (2006.01)
H03K 7/08 (2006.01)
H03K 23/52 (2006.01)

(52) U.S. Cl.
CPC ............... *H03K 21/08* (2013.01); *H03K 7/08* (2013.01); *H03K 23/52* (2013.01)

(58) Field of Classification Search
CPC ........ H03K 21/08; H03K 21/10; H03K 21/02; H03K 21/023; H03K 21/026; H03K 7/08; H03K 23/52
See application file for complete search history.

(56) References Cited

U.S. PATENT DOCUMENTS 8,729,931 B1 * 5/2014 Khalili ................. H03K 3/0315 327/115
8,829,966 B2 * 9/2014 Chang ..................... H03B 19/14 327/199
2012/0014156 A1 1/2012 Park et al.

OTHER PUBLICATIONS

Behzad Razavi, "RF Microelectronics", 2nd Edition, Prentice Hall Communications Engineering and Emerging Technologies Series from Ted Rappaport, Chap. 8, pp. 290-291, Copyright 1998.
Song Hu et al, "Design of a low-powernoise multi-mode divider with 25%-duty-cycle outputs in 0.13um CMOS", 9th IEEE International Conference on ASIC, Oct. 25-28, 2011, pp. 594-597.
Feng-Wei Kuo et al, "A Bluetooth Low-energy Transceiver with 3.7-mW All-Digital Transmitter, 2.75-mW High-IF Discrete-Time Receiver, and TX/RX Switchable On-Chip Matching Network", IEEE Journal of Solid-State Circuits, vol. 52, No. 4, Apr. 2017, pp. 1144-1162.

* cited by examiner

*Primary Examiner* — An T Luu
(74) *Attorney, Agent, or Firm* — Saile Ackerman LLC; Stephen B. Ackerman

(57) ABSTRACT

A divider circuit and method for generating one or more digital signals is presented. The circuit has a first output section for generating a first digital signal. There is a first output section with an output node to output the first digital signal, and a plurality of switches with one or more control switches. The plurality of switches selectively couple the output node to a first voltage and/or to selectively couple the output node to a second voltage, thereby generating the first digital signal. The or each control switch is prevents at least one of (i) the output node being coupled to the first and second voltages simultaneously and (ii) the output node being decoupled from both the first and second voltages simultaneously.

24 Claims, 12 Drawing Sheets

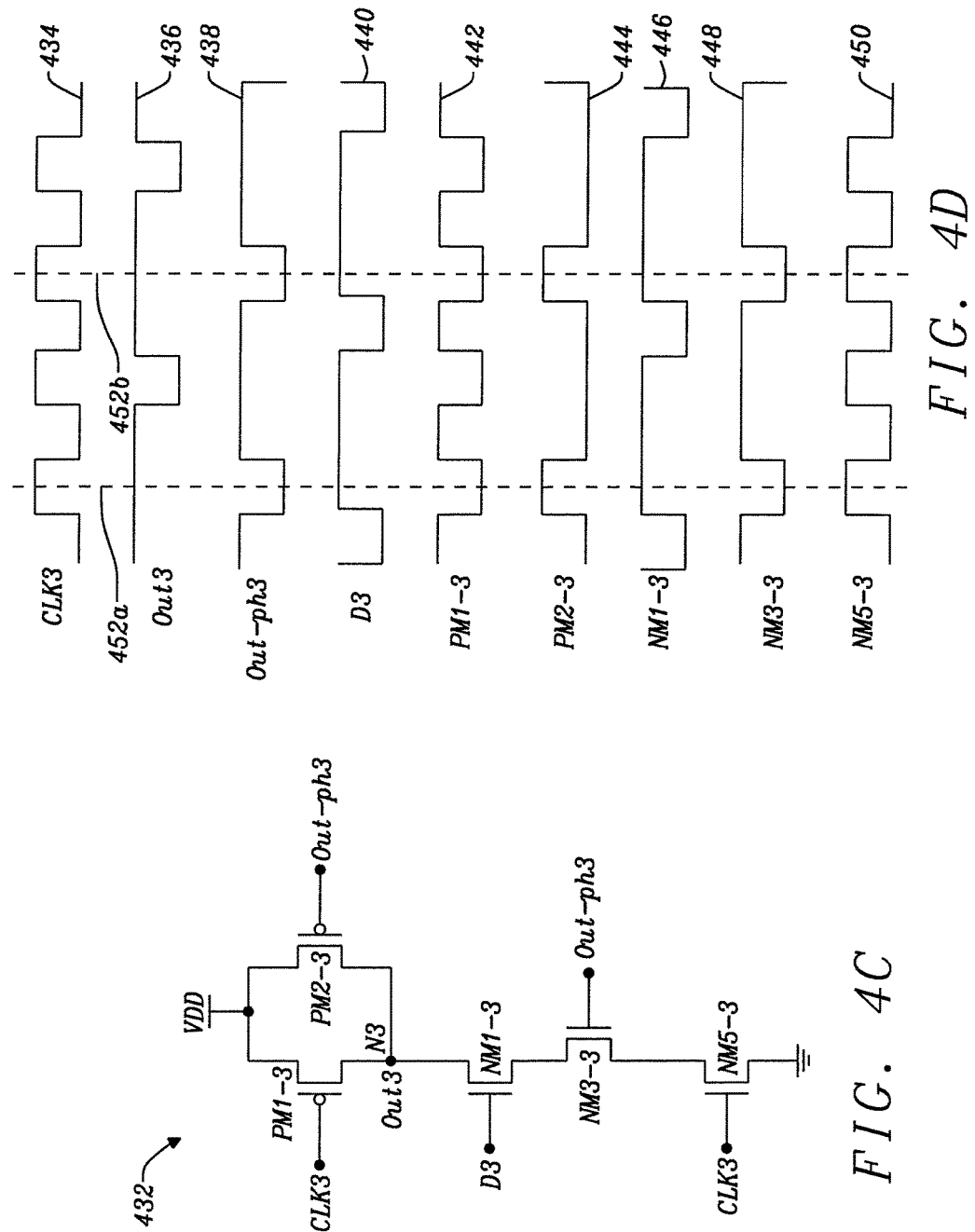

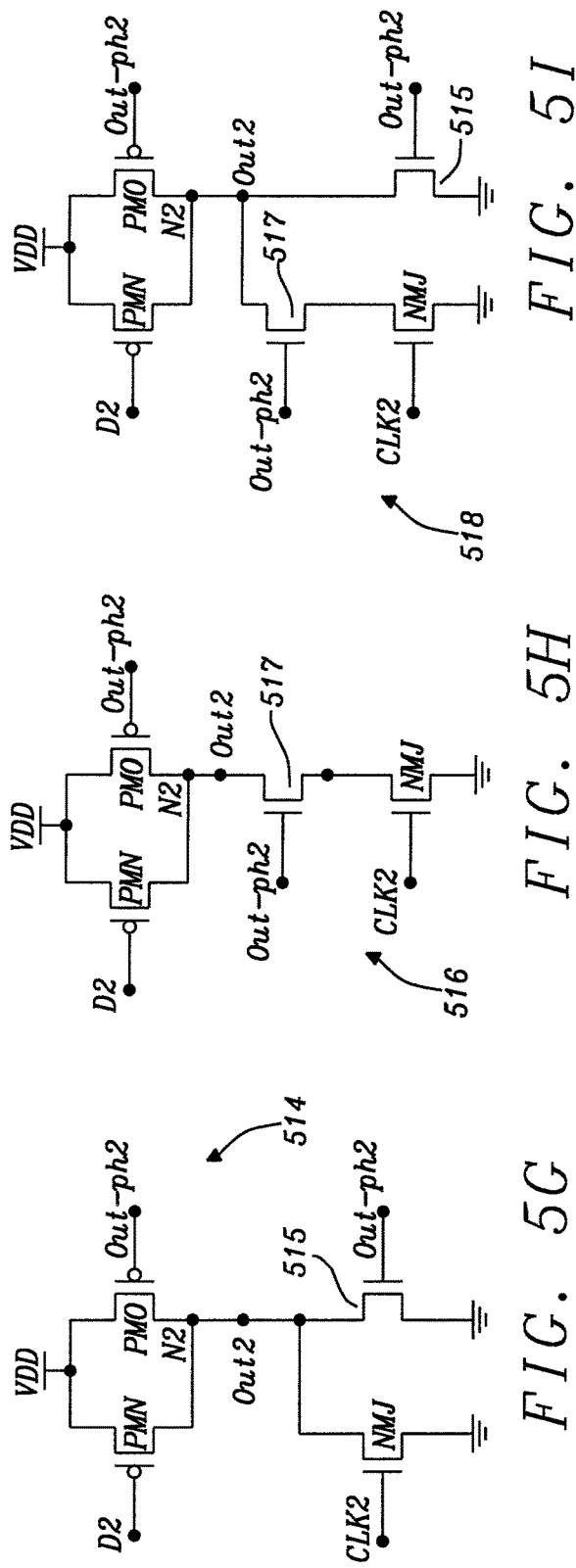

DIVIDER CIRCUIT

TECHNICAL FIELD

The present disclosure relates to a divider circuit. In particular, this disclosure relates to a low power divide-by-2 circuit suitable for the generation of local oscillator (LO) signals for radio applications.

BACKGROUND

In most common radios, a phase-locked loop (PLL) is used to generate a low phase-noise and stable-frequency signal at twice the channel frequency to avoid power amplifier (PA) pulling effects. A high-performance divide-by-2 circuit is then required to generate a local-oscillator (LO) signal at the channel frequency which can be used for up-conversion and down-conversion in transmit (TX) and receive (RX) operations, respectively. A divide-by-2 circuit is a type of divider circuit. A divider circuit may be used to generate one or more digital signals, such as a LO signal.

Frequency mixers are used for frequency translation and are usually implemented in differential design for better noise rejection, second-order linearity and LO signal leakage reduction. Thus, 4-phase (quadrature and differential) LO signals are needed for optimum performance. In particular, it is desirable to generate LO signals with a 25% duty cycle.

The terms "quadrature" and "differential" are used throughout this disclosure. Quadrature is in reference to a second signal being 90° out of phase with a first signal. The first signal may be referred to as an in-phase (I) signal and the second signal may be referred to as a quadrature (Q) signal. The divide-by-two circuits of this disclosure are used to generate 4-phase LO signals, which are labelled in the following format: lo_qp, lo_ip, lo_qn, loin, followed by a number to distinguish between the LO signals that are generated by the different divide-by-two circuits that are presented.

The LO signals lo_ip, lo_qn and loin have a 90°, 180° and 270° phase difference, respectively, with respect to the LO signal lo_qp. It should be noted that the absolute values of the phase difference have been provided here for convenience, and the phase difference values may either be positive or negative.

The LO signal lo_qp phase shifted by 90° gives the quadrature signal of lo_qp, namely the LO signal lo_ip. The quadrature signals of each of the other LO signals will be clear to the skilled person. The LO signals lo_qp, lo_ip, lo_qn, lo_in may therefore be referred to as being in quadrature.

Differential is in reference to a second signal being 180° out of phase with respect to a first signal. The LO signal lo_qp phase shifted by 180° gives the differential signal of lo_qp, namely the LO signal lo_qn. The differential signals of each of the other LO signals will be clear to the skilled person. The LO signals lo_qp, lo_qn may be referred to as being differential signals; and the LO signals lo_ip, lo_in may be referred to as being differential signals.

Although LO signals can be overlapping (not having a 25% duty cycle), a large overlap can affect the front-end gain and increase cross-talk between LO signals which can degrade image rejection. Hence, for optimum performance, non-overlapping (accurate 25% duty-cycles), quadrature-phase, differential signals are needed.

FIG. 1A shows a schematic diagram of a quadrature divide-by-2 circuit 100, which is a type of divider circuit, comprising a first latch 102 and a second latch 104. Each of the latches 102, 104 comprise a positive input DP1, DP2, a negative input DN1, DN2, a positive output QP1, QP2 and a negative output QN1, QN2. A positive clock CLKP1 and a negative clock CLKN1 are received by each of the latches 102, 104. The clocks CLKP1, CLKN1 are differential signals. The divide-by-2 circuit 100 outputs an LO signal lo_qn1, an LO signal lo_ip1, an LO signal lo_qp1 and an LO signal lo_in1, each having a 50% duty cycle. By providing the LO signals to AND gates 106 it is possible to generate LO signals lo_ip_25pc1, lo_qp_25pc1, lo_in_25pc1, lo_qn_25pc1 with a 25% duty cycle. Signal waveforms associated with the quadrature divide-by-2 circuit 100 are shown in FIG. 1B. FIG. 2 shows a latch 200 that may correspond to one or both of the first latch 102 and the second latch 104.

The use of AND gates 106 means that the quadrature divide-by-2 circuit 100 requires extra power to generate 25% duty cycle LO signals. Additionally, the AND gates 106 are susceptible to the high frequencies of the LO signals and therefore noise may be added to the divide-by-2 circuit 100.

A divide-by-2 circuit 300, as shown in FIG. 3A can generate 75% duty cycle LO signals without implementing AND gates and therefore provides reduced power consumption and reduced noise when compared to the divide-by-2 circuit 100. FIG. 3B shows signal waveforms associated with the divide-by-2 circuit 300.

However, the divide-by-2 circuit 300 suffers from the following shortcomings: it exhibits shoot through currents, where there is a direct path between a supply voltage VDD and ground, thereby wasting power; it exhibits high impedance nodes where a node is not connected to the supply voltage VDD or ground, thereby making the node susceptible to noise, charge injection from other switching signals and interference; and an inaccurate duty cycle.

SUMMARY

It is an object of this disclosure to provide a divider circuit with reduced shoot through currents, reduced high impedance nodes and increased duty cycle accuracy over the prior art.

According to a first aspect of the disclosure there is provided a divider circuit for generating one or more digital signals, comprising a first output section, the first output section for generating a first digital signal, the first output section comprising an output node configured to output the first digital signal, and a plurality of switches comprising one or more control switches, wherein the plurality of switches are configured to selectively couple the output node to a first voltage and/or to selectively couple the output node to a second voltage, thereby generating the first digital signal, and the or each control switch is configured to prevent at least one of (i) the output node being coupled to the first and second voltages simultaneously and (ii) the output node being decoupled from both the first and second voltages simultaneously.

Optionally, the plurality of switches comprises one or more clocked switches, a switching operation of the or each clocked switch being controlled by a clock signal received by the or each clocked switch, and the switching operation of the or each clocked switch contributes to at least one of the selective coupling of the output node to the first voltage and to the selective coupling of the output node to the second voltage.

Optionally, a clock edge is a rising or falling edge of the clock signal, a falling edge delay is a time delay between a clock edge that switches the first digital signal from the first voltage to the second voltage and a falling edge of the first digital signal, a rising edge delay is a time delay between a clock edge that switches the first digital signal from the second voltage to the first voltage and a rising edge of the first digital signal, and the one or more clocked switches are arranged to provide a substantially equal falling edge delay and rising edge delay.

Optionally, the one or more clocked switches comprise a first and second clocked switch.

Optionally, a switching operation of the or each control switch is controlled by a second digital signal received by the or each control switch, the switching operation of the or each control switch contributes to at least one of the selective coupling of the output node to the first voltage and to the selective coupling of the output node to the second voltage, and the switching operation of the or each control switch prevents at least one of the output node being coupled to the first and second voltage simultaneously and the output node being decoupled from both the first and second voltages simultaneously.

Optionally, the second digital signal has an approximately 180° phase difference compared with the first digital signal.

Optionally, the divider circuit comprises a first latch, the first latch comprising the first output section and a second output section, the second output section arranged to generate the second digital signal and to provide the second digital signal to the first output section.

Optionally, the one or more control switches comprise a first control switch and a second control switch, the first control switch is arranged to prevent the output node from being decoupled from both the first and second voltages simultaneously, and the second control switch is arranged to prevent the output node from being coupled to both the first and second voltages simultaneously.

Optionally, the plurality of switches comprises an input switch, a switching operation of the input switch being controlled by a third digital signal received by the input switch, and the switching operation of the first input switch contributes to at least one of the selective coupling of the output node to the first voltage and to the selective coupling of the output node to the second voltage.

Optionally, the third digital signal has an approximately 90° phase difference compared with the first digital signal.

Optionally, the divider circuit comprises a first latch and a second latch, the first latch comprising the first output section and the second latch comprising a third output section, the third output section arranged to generate the third digital signal and to provide the third digital signal to the first output section.

Optionally, the plurality of switches comprises one or more clocked switches, a switching operation of the or each clocked switch being controlled by a clock signal received by the or each clocked switch, and the switching operation of the or each clocked switch contributes to at least one of the selective coupling of the output node to the first voltage and to the selective coupling of the output node to the second voltage.

Optionally, the one or more clocked switches comprises a first clocked switch and a second clocked switch, the first clocked switch is arranged to contribute to the selective coupling of the output node to the first voltage, and the second clocked switch is arranged to contribute to the selective coupling of the output node to the second voltage.

Optionally, the first clocked switch and the first control switch are coupled in parallel.

Optionally, the second clocked switch and the second control switch are coupled in series.

Optionally, the switches are transistors.

Optionally, the divider circuit for generating the first, a second, a third and a fourth digital signal, wherein the four digital signals are in quadrature, the divider circuit comprising a first latch comprising the first output section and a second output section, a second latch comprising a third output section and a fourth output section, the first latch and second latch coupled together, and the second, third and fourth output sections are arranged to generate the second digital signal, the third digital signal and the fourth digital signal, respectively.

Optionally, the or each digital signal has a duty cycle of 25%, 50% or 75%.

Optionally, the or each control switch is cross coupled.

According to a second aspect of the disclosure there is provided a divider circuit for generating one or more digital signals, comprising a first output section, the first output section for generating a first digital signal, the first output section comprising an output node configured to output the first digital signal, and a plurality of switches comprising a plurality of clocked switches, a switching operation of each clocked switched being controlled by a clock signal received by each clocked switch, wherein the plurality of switches are configured to selectively couple the output node to a first voltage and/or to selectively couple the output node to a second voltage, thereby generating a first digital signal, a clock edge is a rising or falling edge of the clock signal, a falling edge delay is a time delay between a clock edge that switches the first digital signal from the first voltage to the second voltage and a falling edge of the first digital signal, a rising edge delay is a time delay between a clock edge that switches the first digital signal from the second voltage to the first voltage and a rising edge of the first digital signal, and the clocked switches are arranged to provide a substantially equal falling edge delay and rising edge delay.

Optionally, the switching operation of each clocked switch contributes to at least one of the selective coupling of the output node to the first voltage and to the selective coupling of the output node to the second voltage.

Optionally, the plurality of clocked switches comprise a first and second clocked switch.

Optionally, the first clocked switch is arranged to contribute to the selective coupling of the output node to the first voltage, and the second clocked switch is arranged to contribute to the selective coupling of the output node to the second voltage.

Optionally, the plurality of switches comprises one or more control switches, and the or each control switch is configured to prevent at least one of the output node being coupled to the first and second voltages simultaneously and the output node being decoupled from both the first and second voltages simultaneously.

Optionally, a switching operation of the or each control switch is controlled by a second digital signal received by the or each control switch, the switching operation of the or each control switch contributes to at least one of the selective coupling of the output node to the first voltage and to the selective coupling of the output node to the second voltage, and the switching operation of the or each control switch prevents at least one of the output node being coupled to the first and second voltages simultaneously and the output node being decoupled from both the first and second voltages simultaneously.

Optionally, the second digital signal has an approximately 180° phase difference compared with the first digital signal.

Optionally, the divider circuit comprises a first latch, the first latch comprising the first output section and a second output section, the second output section arranged to generate the second digital signal and to provide the second digital signal to the first output section.

Optionally, the one or more control switches comprise a first control switch and a second control switch, the first control switch is arranged to prevent the output node from being decoupled from both the first and second voltage simultaneously, and the second control switch is arranged to prevent the output node from being coupled to both the first and second voltage simultaneously.

Optionally, the plurality of switches comprises an input switch, a switching operation of the input switch being controlled by a third digital signal received by the input switch, and the switching operation of the first input switch contributes to at least one of the selective coupling of the output node to the first voltage and to the selective coupling of the output node to the second voltage.

Optionally, the third digital signal has an approximately 90° phase difference compared with the first digital signal.

Optionally, the divider circuit comprises a first latch and a second latch, the first latch comprising the first output section and the second latch comprising a third output section, the third output section arranged to generate the third digital signal and to provide the third digital signal to the first output section.

Optionally, the first clocked switch and the first control switch are coupled in parallel.

Optionally, the second clocked switch and the second control switch are coupled in series.

Optionally, the switches are transistors.

Optionally, the divider circuit for generating the first, a second, a third and a fourth digital signal, wherein the four digital signals are in quadrature, the divider circuit comprising a first latch comprising the first output section and a second output section, a second latch comprising a third output section and a fourth output section, the first latch and second latch coupled together, and the second, third and fourth output sections are arranged to generate the second digital signal, the third digital signal and the fourth digital signal, respectively.

Optionally, the or each digital signal has a duty cycle of 25%, 50% or 75%.

Optionally, the or each control switch is cross coupled.

Optionally, another embodiment is a method for generating one or more digital signals from a divider circuit. The method includes generating a first digital signal, outputting a first digital signal, selectively coupling the output node to a first voltage or a second voltage and the selective preventing of the coupling of the output node to the first and second voltages simultaneously or the preventing of the output node from being decoupled from both first and second voltages simultaneously.

BRIEF DESCRIPTION OF THE DRAWINGS

The disclosure is described in further detail below by way of example and with reference to the accompanying drawings, in which:

FIG. 4C shows an output section which may correspond to an output section of FIG. 4A, and FIG. 4D shows signal waveforms and transistor states associated with the output section of FIG. 4C.

DESCRIPTION

This disclosure relates to a low power divide-by-2 circuit with reduced shoot through currents, reduced high impedance nodes and increased duty cycle accuracy.

Figure 1A:
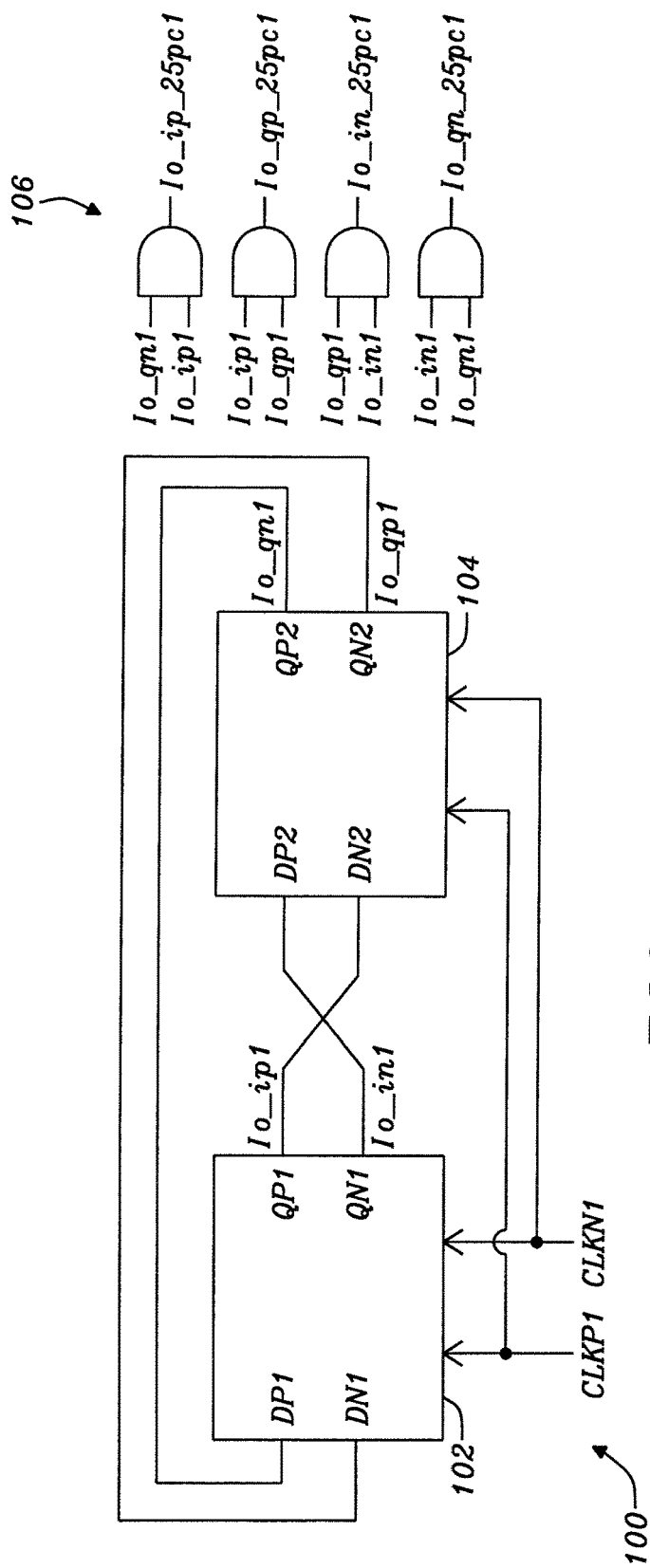
FIG. 1A is a schematic of a first divide-by-2 circuit in accordance with the prior art.

FIG. 1A shows the divide-by-2 circuit 100 with the first latch 102 coupled to the second latch 104 in a loop. The positive output QP2 and the negative output QN2 of the second latch 104 provide the LO signal lo_qn1 and the LO signal lo_qp1 to the positive input DP1 and the negative input DN1, respectively. The outputs QP1, QN1 of the first latch 102 are inverted in their application to the second latch 104 in that the positive output QP1 and the negative output QN1 of the first latch 102 provide the LO signal lo_ip1 and the LO signal lo_in1 to the negative input DN2 and the positive input DP2, respectively.

Figure 1B:
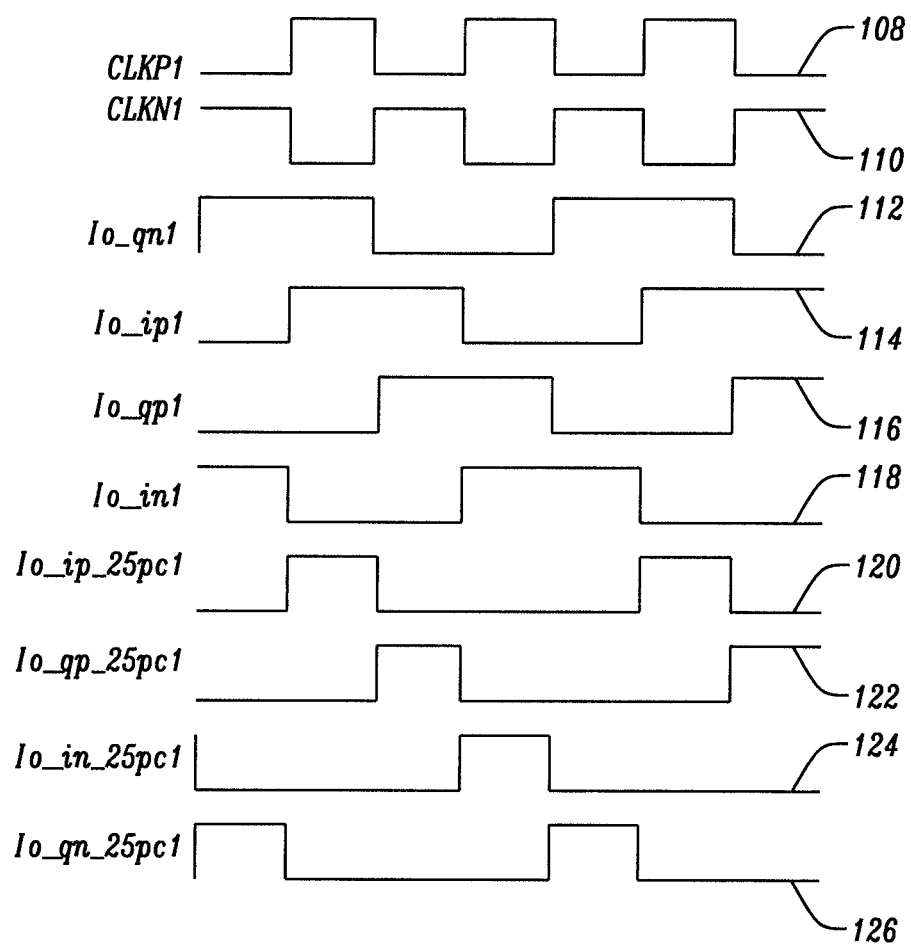
FIG. 1B shows signal waveforms associated with the divide-by-2 circuit of FIG. 1A.

FIG. 1B shows the following waveforms: the positive clock CLKP1 108; the negative clock CLKN1 110; the LO signal lo_qn1 112; the LO signal lo_ip1 114; the LO signal lo_qp1 116; the LO signal lo_in1 118; the LO signal lo_ip_25pc1 120; the LO signal lo_qp_25pc1 122; the LO signal lo_in_25pc1 124; and the LO signal lo_qn_25pc1 126. Each signal may be in a logic high state, that may correspond to the supply voltage VDD, or may be in a logic low state, that may correspond to 0 or ground. A logic high state may simply be referred to as "high" and a logic low state may simply be referred to as "low"

From FIG. 1B it can be observed that at every rising edge of the positive clock CLKP1 108, the LO signals lo_ip1 114, lo_in1 118, which are outputs of the first latch 102, are inverted, in that they switch from low to high or from high to low. At every rising edge of the negative clock CLKN1 110, the LO signals lo_qn1 112, lo_qp1 116, which are outputs of the second latch 104, are inverted. Consequently, each of the LO signals lo_qn1 112, lo_ip1 114, lo_qp1 116, lo_in1 118 have a 50% duty cycle. As the clocks CLKP1 108, CLKN1 110 are differential, the LO signals lo_qn1 112, lo_ip1 114, lo_qp1 116, lo_in1 118 are in quadrature.

The use of the AND gates 106 to apply an AND operation between: lo_qn1 112 and lo_ip1 114; lo_ip1 114 and lo_qp1 116; lo_qp1 116 and lo_in1 118; lo_in1 118 and lo_qn1 112 provide quadrature differential outputs with 25% duty-cycle, as shown by the LO signals: lo_ip_25pc1 120, lo_qp_25pc1 122, lo_in_25pc1 124 and lo_qn_25pc 126.

As described previously, the use of the AND gates 106 to generate 25% duty cycle LO signals requires extra power and can also result in noise being added to the divide-by-2 circuit 100.

Figure 2:
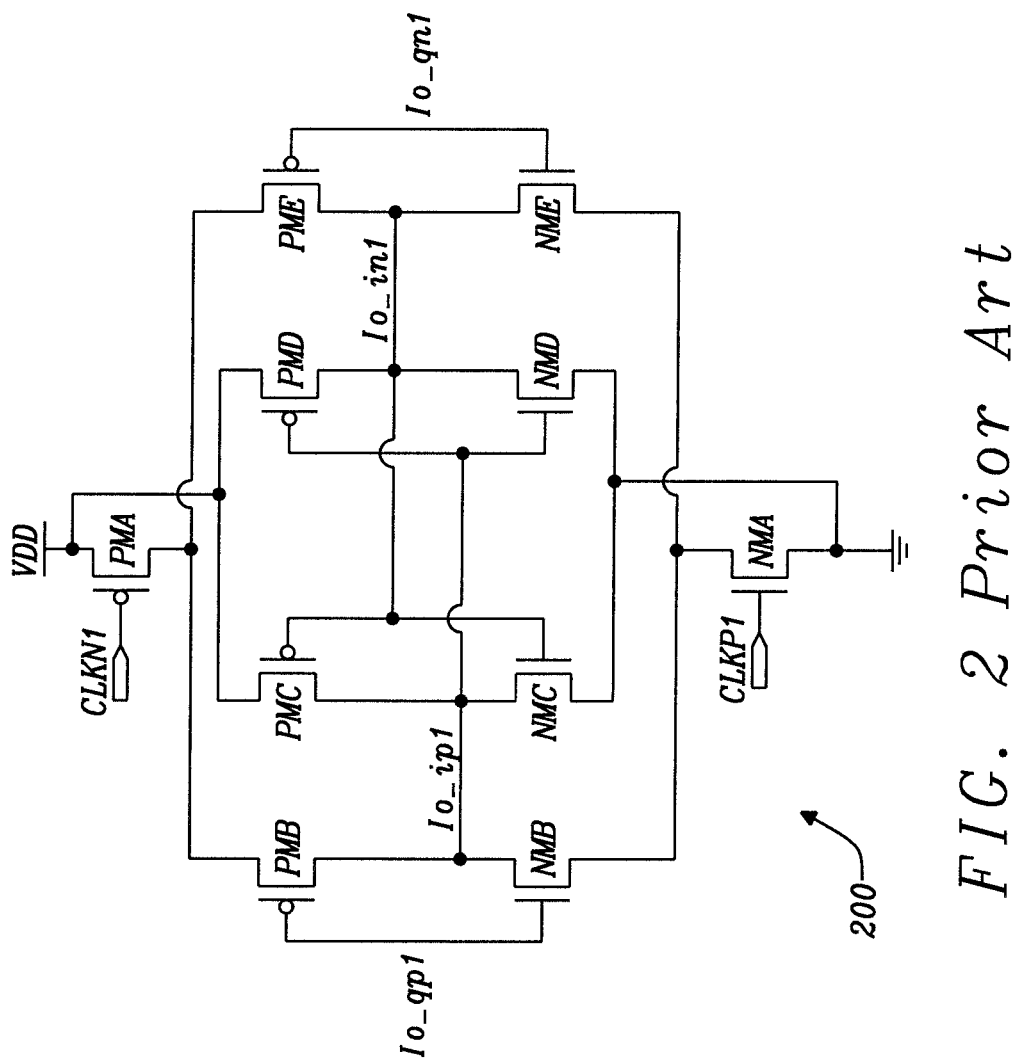
FIG. 2 is a schematic of a latch in accordance with the prior art that may be implemented in the divide-by-2 circuit of FIG. 1A.

As described previously, FIG. 2 shows a latch 200 that may correspond to one or both of the first latch 102 and the second latch 104. The latch 200 comprises a plurality of transistors PMA, PMB, PMC, PMD, PME, NMA, NMB, NMC, NMD, NME.

A clocked inverter is formed by PMA, PMB, NMB and NMA and its differential counterpart is formed by PMA, PME, NME and NMA. The clocked inverter and its differential counterpart may be referred to as differential clocked inverters.

Transistors PMA and NMA are common-mode transistors. A first cross-coupled inverter is formed by PMC and NMC, and a second cross-coupled inverter is formed by PMD and NMD. The cross-coupled inverters are cross coupled at the differential inputs. Cross coupling of the first cross-coupled inverter improves rise times of the edges of the LO signals lo_qn1 112, lo_ip1 114, lo_qp1 116, lo_in1 118; and cross coupling of the second cross-coupled inverter improves fall times of the edges of the LO signals lo_qn1 112, lo_ip1 114, lo_qp1 116, lo_in1 118. The cross-coupled inverters are also used to avoid common-mode oscillations and are usually sized 20-30% of the differential clocked inverters.

A transistor's size is in reference to its W/L ratio which is the ratio of a transistor's width (W) to its length (L). Usually the length of a transistor is fixed to achieve a certain frequency of operation and only the width is scaled to adjust noise, mismatch and load driving capability. In the present example concerning the latch 200, the width of the transistors of the cross-coupled inverters are typically 20-30% of the width of the transistors of the differential clocked inverters, thereby resulting in the cross-coupled inverters being sized 20-30% of the differential inverters.

Figure 3A:
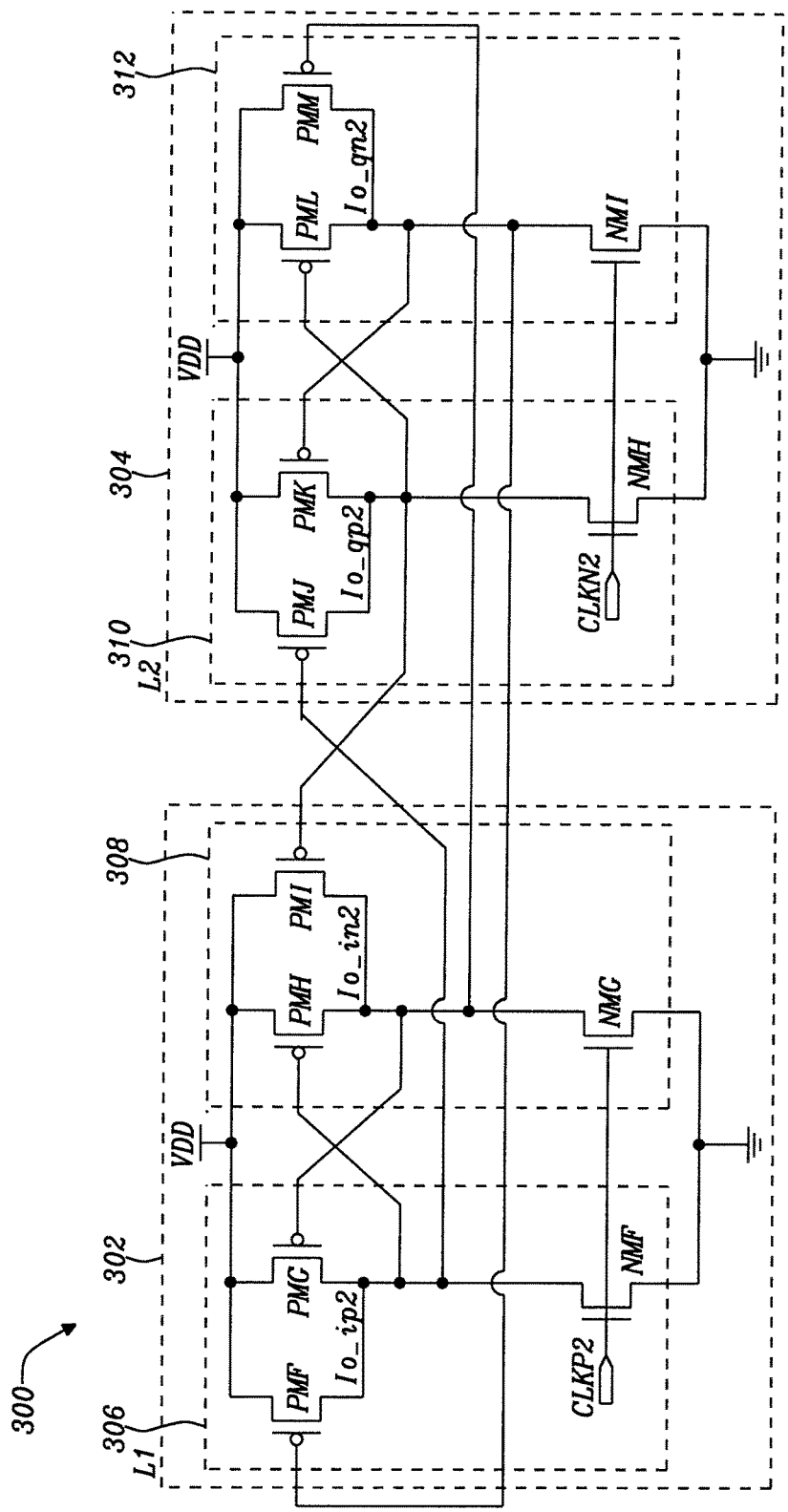
FIG. 3A is a schematic of a second divide-by-2 circuit in accordance with the prior art.

The divide-by-2 circuit 300 shown in FIG. 3A generates 75% duty cycle LO signals without implementing AND gates. The LO signals are as follows: lo_in2, lo_qn2, lo_ip2 and lo_qp2. It is possible to modify the divide-by-2 circuit 300 to provide 25% duty cycle LO signals by switching each of the PMOS transistors with an NMOS transistor and switching each of the NMOS transistors with a PMOS transistor. Alternatively, each of the LO signals lo_in2, lo_qn2, lo_ip2 and lo_qp2 may be buffered using an inverter to provide LO signals with 25% duty cycle. One level of buffering between the divider and the load (the frequency mixer) is generally preferred to provide reverse isolation from load to divider.

The divide-by-2 circuit 300 comprises a first latch 302 and a second latch 304. Each latch 302, 304 may be divided into two output sections, where each output section is used to generate one of the four LO signals lo_in2, lo_qn2, lo_ip2, lo_qp2 at a node. The first latch 302 comprises a first output section 306 and a second output section 308; and the second latch 304 comprises a fourth output section 310 and a third output section 312.

The first output section 306 is for generating a first digital signal, namely the LO signal lo_ip2; the second output section 308 is for generating a second digital signal, namely the LO signal lo_in2; the third output section 312 is for generating a third digital signal, namely lo_qn2; and the fourth output section 310 is for generating a fourth digital signal, namely lo_qp2. Each output section 306, 308, 310, 312 comprises an output node that is configured to output the associated LO signal.

Each output section 306, 308, 310, 312 comprises a plurality of switches that are configured to selectively couple their respective output nodes to a first voltage and/or to selectively couple their respective output nodes to a second voltage, thereby generating their respective digital signals.

In this case, the first voltage corresponds to a supply voltage VDD and the second voltage corresponds to ground, and the switches are implemented as transistors.

"Selectively coupling" is in reference to the coupling and decoupling of a voltage to an output node, as controlled by a control signal received by a switch.

The first output section 306 comprises three transistors: PMF, PMG, NMF; the second output section 308 comprises three transistors: PMH, PMI, NMG; the fourth output section 310 comprises three transistors: PMJ, PMK, NMH; and the third output section 312 comprises three transistors: PML, PMM, NMI. The transistors NMF and NMG are coupled to a positive clock CLKP2 and the transistors NMH and NMI are coupled to a negative clock CLKN2. CLKP2 and CLKN2 are differential signals.

Figure 3B:
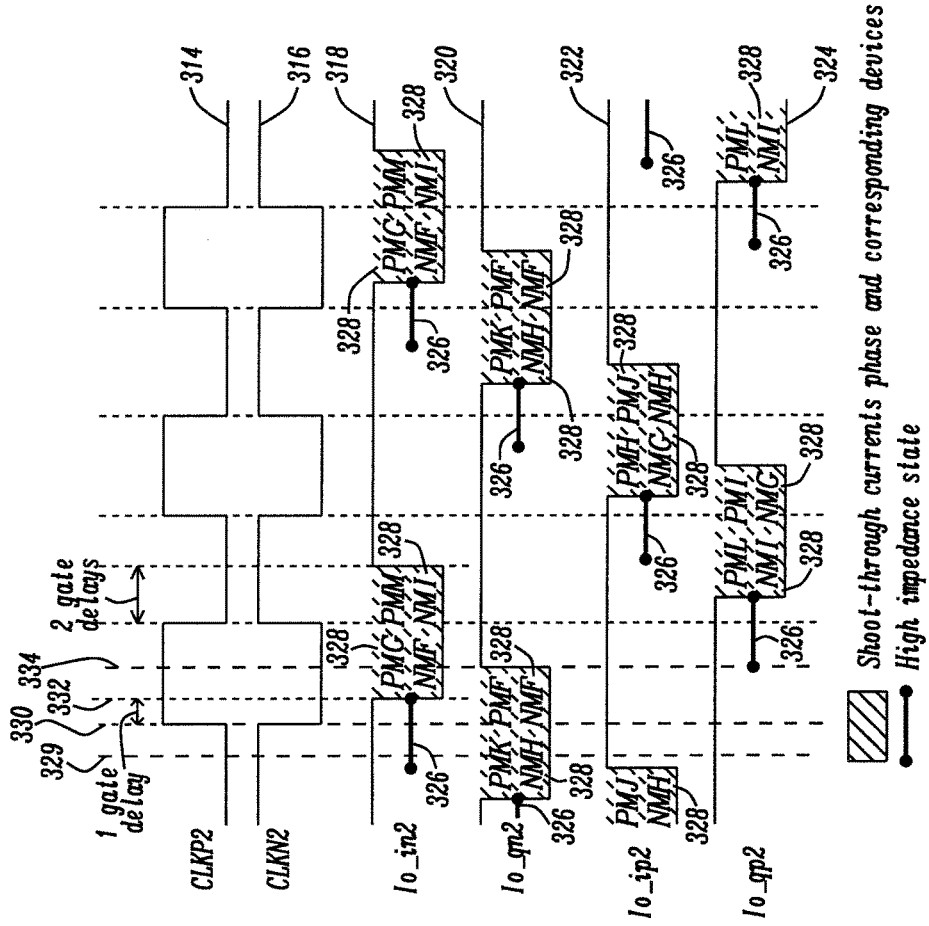
FIG. 3B shows signal waveforms associated with the divide-by-2 circuit of FIG. 3A.

FIG. 3B shows the following waveforms associated with the operation of the divide-by-2 circuit 300: the positive clock CLKP2 314; the negative clock CLKN2 316; the LO signal lo_in2 318; the LO signal lo_qn2 320; the LO signal lo_ip2 322; the LO signal lo_qp2 324. Each signal may be in a logic high state, that may correspond to the supply voltage VDD, or may be in a logic low state, that may correspond to 0 or ground. A logic high state may simply be referred to as "high" and a logic low state may simply be referred to as "low"

The basic principle of operation of the divide-by-2 circuit 300 is as follows: when one of the clocks, CLKP2 314 or CLKN2 316, goes high, one of the nodes is pulled to zero, as shown by a switch to the logic low state in one of lo_in2 318, lo_qn2 320, lo_ip2 322, lo_qp2 324; and when one of the clocks, CLKP2 314 or CLKN2 316, goes low, the node previously pulled to zero is reset to the supply voltage VDD, as shown by a switch to the logic high state in one of lo_in2 318, lo_qn2 320, lo_ip2 322, lo_qp2 324. Therefore, each of the LO signals lo_in2 318, lo_qn2 320, lo_ip2 322, lo_qp2 324 has a 75% duty cycle.

The divide-by-2 circuit 300 exhibits the following shortcomings: it does not provide an accurate 75% duty cycle; during its operation there are shoot through currents; and during its operation there are high impedance nodes.

The duty cycle accuracy is in reference to the divide-by-2 circuit 300 not providing an accurate 75% duty cycle. This is due to differences in gate delays before a LO signal switches state and will be described in further detail below.

Shoot through currents arise when there is a low impedance path between the supply voltage VDD and ground. This results in current flowing when a state is not changing and consequently wastes power.

High impedance nodes occur when a node is not connected to the supply voltage VDD or ground and can therefore drift to any voltage value or leak current. Therefore, it may be said that high impedance nodes are not "well-defined" when compared to nodes that are coupled to one of the supply voltage VDD or ground. In a high impedance state, a node is more susceptible to noise, charge injection from other switching signals and interference. High impedance nodes are more prone to layout effects and can negatively affect systematic quadrature and differential accuracy.

Each of these will be described in more detail with reference to the waveforms shown in FIG. 3B in addition to consideration of the operation of a single output section shown in FIG. 3C and its corresponding waveforms shown in FIG. 3D.

Shown in FIG. 3B are high impedance states 326 where the switching operation of the divide-by-2 circuit 300 has placed a node in a high impedance state; and shoot through current phases 328 where the switching operation of the divide-by-2 circuit 300 has resulted in a low impedance path between the supply voltage VDD and ground which can result in shoot through currents. For the shoot through current phases 328, the transistors presently in an "on" state at a given time and leading to the shoot through current path from the supply voltage VDD to ground, are shown on FIG. 3B. Current is able to flow through a transistor when it is in an "on" state, and is unable to flow through the transistor when it is in an "off" state.

Considering FIG. 3B, at a first time 329, the signals are as follows: CLKP2 314 is low, CLKN2 316 is high, lo_in2 318 is high, lo_qn2 320 is low, lo_ip2 322 is high and lo_qp2 324 is high. As can be observed, lo_in2 318 is in the high impedance state 326. The node that outputs lo_in2 318 is close to the supply voltage VDD as denoted by a logic high signal, however the node is not connected to the supply voltage VDD or ground and is therefore not well defined.

In the high impedance state 326, lo_in2 318 does not have a well-defined value and therefore the fall time as it changes state from high to low will vary depending on the voltage at the associated node.

At a second time 330, CLKP2 314 goes high and both transistors PMF and NMF are turned on. It is necessary that transistor PMF is sized stronger than transistor NMF in order for transistor PMF to remain in the on state. As discussed previously, "sized" is in reference to a transistors W/L ratio. "Sized stronger" means that, in the present example, the width of the transistor PMF is greater than that of the transistor NMF.

At a third time 332, after one gate delay has passed since the second time 330, lo_in2 318 falls to low, which reinforces lo_ip2 322 to remain at a high logic level through transistor PMG. There are shoot through current paths between transistors PMF, NMF and transistors PMG, NMF as shown by the shoot through current phases 328.

A gate delay is in reference to the time taken for one of the transistors to change state from "on" to "off" or from "off" to "on" after having received a signal at its gate. For example, a logic high signal may maintain a transistor in an "on" state, and after the logic high signal changes to a logic low signal there will be a gate delay before the transistor changes to the "off" state.

At a fourth time 334, which is one gate delay after the third time 332, lo_qn2 320 rises from low to high. This turns off transistor PMF, but there is still a shoot through current path between PMG and NMF. All LO signals are now high, except lo_in2 318 which is low. After a time period, CLKP2 314 falls to low and CLKN2 316 rises to high and a similar process follows for lo_in2 318 changing to high and lo_qp2 324 changing to low. It will be clear to the skilled person how this process continues and how each of the LO signals lo_in2 318, lo_qn2 320, lo_ip2 322, lo_qp2 324 vary.

A key concept to notice in the circuit operation shown in FIG. 3B is that there is one gate delay after a clock edge after which one of the LO signals lo_in2 318, lo_qn2 320, lo_ip2 322, lo_qp2 324 changes from high to low; and two gate delays after a clock edge after which one of the LO signals lo_in2 318, lo_qn2 320, lo_ip2 322, lo_qp2 324 changes from low to high. The clock edge refers to a rising or falling edge of one of the clock signals CLKP2 314, CLKN2 316.

The falling edge of one of the LO signals lo_in2 318, lo_qn2 320, lo_ip2 322, lo_qp2 324 occurs after one gate delay after a clock edge, and the rising edge of one of the LO signals lo_in2 318, lo_qn2 320, lo_ip2 322, lo_qp2 324 occurs after two gate delays after a clock edge.

A rising edge delay is a time delay between a clock edge that switches an LO signal from low to high, and a rising edge of the LO signal. A falling edge delay is a time delay between a clock edge that switches an LO signal from high to low, and a falling edge of the LO signal.

The rising edge delay and the falling edge delay for the LO signals lo_in2 318, lo_qn2 320, lo_ip2 322, lo_qp2 324 are unequal, which results in an inaccurate duty cycle that is close to, but not exactly, 75%. The rising edge delay is equal to two gate delays and the falling edge delay is equal to one gate delay.

The falling edge delay of the LO signals lo_in2 318, lo_qn2 320, lo_ip2 322 and lo_qp2 324 are controlled by the transistors NMG, NMI, NMF and NMH, respectively. The rising edge delay of the LO signals lo_in2 318, lo_qn2 320, lo_ip2 322 and lo_qp2 324 are controlled by the transistors PMH, PML, PMF and PMJ, respectively. As the transistors NMG, NMI, NMF, NMH are directly coupled to one of the clock signals CLKP2 314, CLKN2 316 they are subject to one gate delay before switching, such that the falling edge delay is one gate delay. However, as the transistors PMH, PML, PMF, PMJ are not directly coupled to a clock and their switching is dependent on the LO signals they are subject to two gate delays before switching: one gate delay for switching of the associated LO signal lo_in2 318, lo_qn2 320, lo_ip2 322 and lo_qp2 324, and then one gate delay for the switching of the transistor PMH, PML, PMF, PMJ. Therefore, the rising edge delay and the falling edge delay are unequal.

As mentioned previously, it is necessary that transistor PMF is sized stronger than the transistor NMF in order for transistor PMF to remain in the on state. It will be appreciated that this applies to all p-type and n-type transistors in the divide-by-2 circuit 300, where it is necessary that the p-type transistors PMF, PMG, PMH, PMI, PMJ, PMK, PML, PMM are sized stronger than their associated n-type transistors NMF, NMG, NMH, NMI. Transistors PMF, PMG must be sized stronger than NMF; transistors PMH, PMI, must be sized stronger than NMG; transistors PMJ, PMK must be sized stronger than transistor NMH; and transistors PML, PMM must be sized stronger than NMI.

The p-type transistors PMF, PMG, PMH, PMI, PMJ, PMK, PML, PMM are typically sized two or three times stronger than the associated n-type transistors NMF, NMG, NMH, NMI to account for process variations (which may be approximately 30%). In a typical prior art inverter circuit, p-type and n-type transistors are sized to provide equal drive strengths.

Due to the different sizing of the p-type transistors PMF, PMG, PMH, PMI, PMJ, PMK, PML, PMM compared to the associated n-type transistors NMF, NMG, NMH, NMI, they have different drive strengths, such that the rise times and fall times associated with the p-type transistors PMF, PMG, PMH, PMI, PMJ, PMK, PML, PMM differs from that of the n-type transistors NMF, NMG, NMH, NMI. Therefore, it will be appreciated that variations in rise times and fall times will lead to further inaccuracy of the duty cycle of each of the LO signals lo_in2 318, lo_qn2 320, lo_ip2 322, lo_qp2 324.

It is useful to consider the operation of a single output section to aid clarity in the description of the operation of the divide-by-2 circuit 300. FIG. 3C shows an output section 336 which may correspond to any of the output sections 306, 308, 310, 312. For example, the divide-by-2 circuit 300 may comprise four output sections of the type shown in FIG. 3C where each of the output sections 306, 308, 310, 312 correspond to the output section 336.

The output section 336 comprises a first p-type transistor PMN, a second p-type transistor PMO and a first n-type transistor NMJ. The p-type transistors PMN, PMO are coupled in parallel, and have a first terminal coupled to a supply voltage VDD and a second terminal coupled at an output node N2. The output node N2 is coupled to the n-type transistor NMJ at a first terminal, and the n-type transistor NMJ has a second terminal coupled to ground. A gate of the first p-type transistor PMN receives an input signal D2; a gate of the second p-type transistor PMO receives a phase-shifted output signal Out-ph2; the output node N2 outputs an output signal Out2; and the n-type transistor NMJ receives a clock signal CLK2 at a gate.

Figures 3C, 3D:
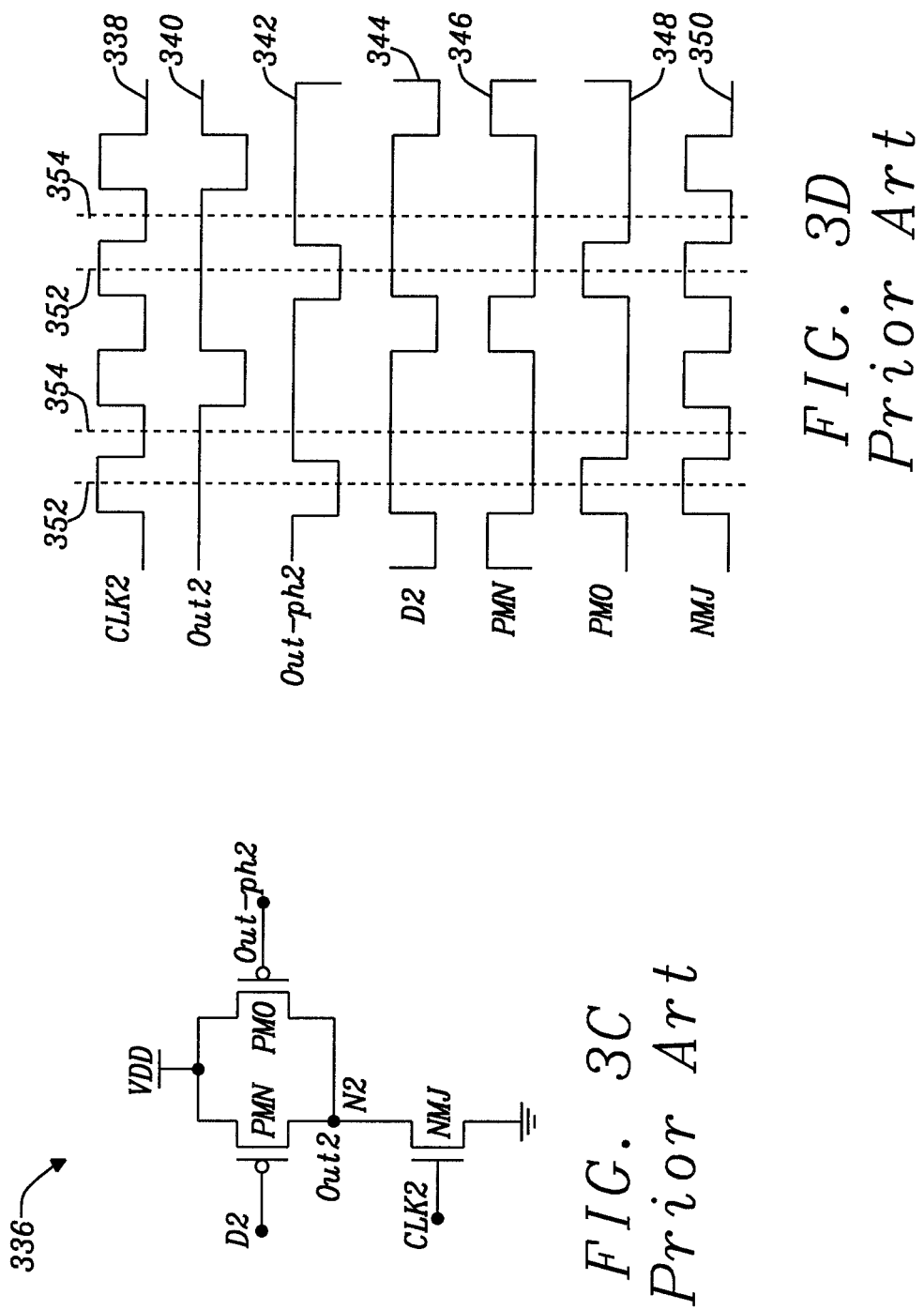
FIG. 3C shows an output section which may correspond to an output section of FIG. 3A.
FIG. 3D shows signal waveforms and transistor states associated with the output section of FIG. 3C.

FIG. 3D shows signal waveforms and transistor states associated with the operation of the output section 336. The gate delays have been omitted in FIG. 3D to aid in the clarity of description. Therefore FIG. 3D is primarily concerned with illustrating the occurrence of shoot through currents and high impedance nodes. However, it will be appreciated that in the physical implementation of the divide-by-2 circuit 300, gate delays will be present, as shown in FIG. 3B.

The following signal waveforms and transistor states are shown: the clock signal CLK2 338; the output signal Out2 340; the phase-shifted output signal Out-ph2 342; the input signal D2 344; the first p-type transistor PMN state 346; the second p-type transistor PMO state 348; and the first n-type transistor NMJ state 350.

For the transistors, a high state denotes that the transistor is "on" and will allow current flow, and a low state denotes that the transistor is "off" and will not allow current flow. If one of the p-type transistors PMN, PMO receives a high signal at its gate, it switches off, and if it receives a low signal it switches on. If the first n-type transistor NMJ receives a high signal at its gate, it switches on, and if it receives a low signal it switches off. The phase-shifted output signal Out-ph2 342 has a 180° phase difference compared with the output signal Out2 340.

Shoot through currents 352 are present when there is a path between the supply voltage VDD and ground. This occurs when at least one of the p-type transistors PMN, PMO is on and the first n-type transistor NMJ is on.

The inclusion of unequal rising edge delays and falling edge delays, as will be the case in the physical implementation of the divide-by-2 circuit 300, results in further occurrences of shoot through currents as described for FIG. 3B. Shoot through currents arising from unequal rising edge delays and falling edge delays are not shown in FIG. 3D as gate delays are omitted from FIG. 3D.

High impedance nodes 354 are present when the output node N2 is not coupled to either of the supply voltage VDD and ground. This occurs when all transistors PMN, PMO, NMJ are off.

As mentioned previously the output section 336 may correspond to the output sections 306, 308, 310, 312. For example, if the output section 336 corresponds to the first output section 306, then the first p-type transistor PMN will correspond to the transistor PMF; the second p-type transistor PMO will correspond to the transistor PMG; the first n-type transistor NMJ will correspond to the transistor NMF; the clock signal CLK2 338 will correspond to the clock CLKP2 314; the output signal Out2 340 will correspond to the LO signal lo_ip2 322; the input signal D2 344 will correspond to the LO signal lo_qn2 320; and the phase-shifted output signal Out-ph2 342 will correspond to the LO signal lo_in2 318. It will be clear to the skilled person how the output section 336 could be implemented in the other output sections 308, 310, 312 to form the divide-by-2 circuit 300.

Figure 4A:
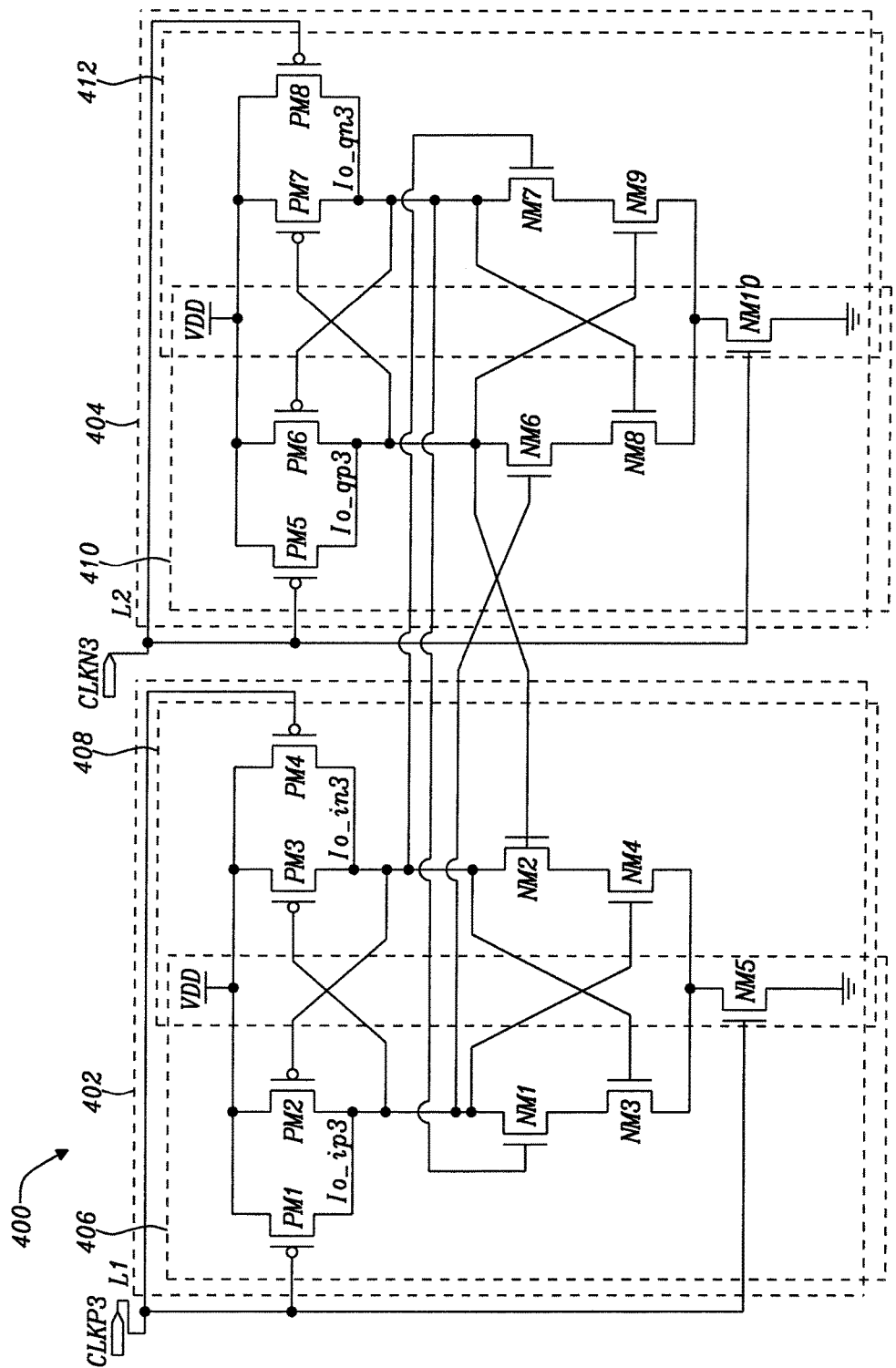
FIG. 4A is a schematic of a divide-by-2 circuit in accordance with an embodiment of the present disclosure.

FIG. 4A shows a schematic of a divide-by-2 circuit 400 in accordance with a first embodiment of this disclosure. The divide-by-2 circuit 400 generates 75% duty cycle LO signals without implementing AND gates and substantially eliminates shoot through currents and high impedance nodes. Additionally, the divide-by-2 circuit 400 provides a 75% duty cycle with a greater accuracy than that of the prior art as described in FIG. 3.

The divide by-2 circuit 400 comprises a first latch 402 and a second latch 404. Each latch 402, 404 may be divided into two output sections, where each output section is used to generate one of the four LO signals: lo_in3, lo_qn3, lo_ip3, lo_qp3 at a node. The first latch 402 comprises a first output section 406 and a second output section 408; and the second latch 404 comprises a fourth output section 410 and a third output section 412.

It will be appreciated that the use of "first", "second", "third" and "fourth" to distinguish between output sections is not intended to be limiting. For example, a "first" output section may be in reference to any output section of a divider circuit.

The first output section 406 is for generating a first digital signal, namely the LO signal lo_ip3; the second output section 408 is for generating a second digital signal, namely the LO signal lo_in3; the third output section 412 is for generating a third digital signal, namely lo_qn3; and the fourth output section 410 is for generating a fourth digital signal, namely lo_qp3. Each output section 406, 408, 410, 412 comprises an output node that is configured to output the associated LO signal.

Each output section 406, 408, 410, 412 comprises a plurality of switches that are configured to selectively couple their respective output nodes to a first voltage and/or to selectively couple their respective output nodes to a second voltage, thereby generating their respective digital signals.

In this case, the first voltage corresponds to a supply voltage VDD and the second voltage corresponds to ground (which may correspond to 0V), and the switches are implemented as transistors.

"Selectively coupling" is in reference to the coupling and decoupling of a voltage to an output node, as controlled by a control signal received by a switch.

The first output section 406 comprises five transistors: PM1, PM2, NM1, NM3, NM5; the second output section 408 comprises five transistors PM3, PM4, NM2, NM4, NM5; the fourth output section 410 comprises five transistors: PM5, PM6, NM6, NM8, NM10; and the third output section 412 comprises five transistors: PM7, PM8, NM7, NM9, NM10. It can be seen that the transistor NM5 is shared between the first output section 406 and the second output section 408; and that the transistor NM10 is shared between the fourth output section 410 and the third output section 412. It will be appreciated that each of the first and second output sections 406, 408 may each implement a different transistor rather than sharing transistor NM5. This is also the case for the fourth and third output sections 410, 412 and the transistor NM10. The transistors PM1, PM4, NM5 are coupled to a positive clock CLKP3; and the transistors PM5, PM8, NM10 are coupled to a negative clock CLKN3. CLKP3 and CLKN3 are differential signals.

Figure 4B:
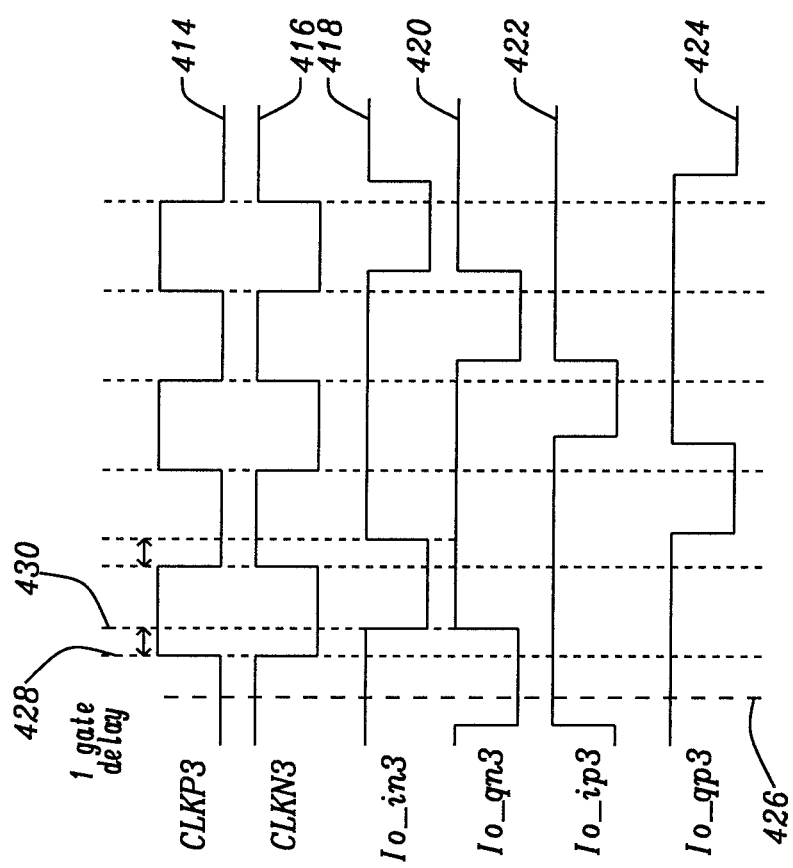
FIG. 4B shows signal waveforms associated with the divide-by-2 circuit of FIG. 4A.

FIG. 4B shows the following waveforms associated with the operation of the divide-by-2 circuit 400: the positive clock CLKP3 414; the negative clock CLKN3 416; the LO signal lo_in3 418; the LO signal lo_qn3 420; the LO signal lo_ip3 422; the LO signal lo_qp3 424. Each signal may be in a logic high state, that may correspond to the supply voltage VDD, or may be in a logic low state, that may correspond to 0 or ground. A logic high state may simply be referred to as "high" and a logic low state may simply be referred to as "low"

The basic principle of operation of the divide-by-2 circuit 400 is similar to that of the divide-by-2 circuit 300, however the issues concerning inaccurate duty cycle, shoot through currents and high impedance nodes have been resolved. When one of the clocks, CLKP3 414 or CLKN3 416, goes high, one of the nodes is pulled to zero, as shown by a switch to the logic low state in one of lo_in3 418, lo_qn3 420, lo_ip3 422, lo_qp3 424; and when one of the clocks, CLKP3 414 or CLKN3 416, goes low, the node previously pulled to zero is reset to the supply voltage VDD, as shown by a switch to the logic high state in one of lo_in3 418, lo_qn3 420, lo_ip3 422, lo_qp3 424. Therefore, each of the LO signals lo_in3 418, lo_qn3 420, lo_ip3 422, lo_qp3 424 have a 75% duty cycle.

It is possible to modify the divide-by-2 circuit 400 to provide 25% duty cycle LO signals by switching each of the PMOS transistors with an NMOS transistor and switching each of the NMOS transistors with a PMOS transistor. Alternatively, each of the LO signals lo_in3 418, lo_qn3 420, lo_ip3 422, lo_qp3 424 may be buffered using an inverter to provide LO signals with 25% duty cycle.

Considering FIG. 4B, at a first time 426, the signals are as follows: CLKP3 414 is low, CLKN3 416 is high, lo_in3 418 is high, lo_qn3 420 is low, lo_ip3 422 is high and lo_qp3 424 is high. At a second time 428, CLKP3 414 goes high and at a third time 430, after one gate delay, lo_in3 418 falls to zero. lo_in3 418 turns on PM2 which prevents a high impedance state at an output node of the first output section 406. Transistor NM3 turns off and breaks the shoot through current path between the supply voltage VDD and ground in the first output section 406. lo_qn3 420 rises from low to high, which means the LO signals lo_qn3 420, lo_ip3 422, lo_qp3 424 are high. After a time period, CLKP3 414 falls to low and CLKN3 416 rises to high and a similar process follows for lo_in3 418 changing to high and lo_qp3 424 changing to low. It will be clear to the skilled person how this process continues and how each of the LO signals lo_in3 418, lo_qn3 420, lo_ip3 422, lo_qp3 424 vary.

In FIG. 4B it can be seen that there is one gate delay after a clock edge after which one of the LO signals lo_in3 418, lo_qn3 420, lo_ip3 422, lo_qp3 424 changes from high to low; and one gate delay after a clock edge after which one of the LO signals lo_in3 418, lo_qn3 420, lo_ip3 422, lo_qp3 424 changes from low to high. The clock edge refers to a rising or falling edge of one of the clock signals CLKP3 414, CLKN3 416.

The falling edge of one of the LO signals lo_in3 418, lo_qn3 420, lo_ip3 422, lo_qp3 424 occurs after one gate delay after a clock edge, and the rising edge of one of the LO signals lo_in3 418, lo_qn3 420, lo_ip3 422, lo_qp3 424 occurs after one gate delay after a clock edge.

A rising edge delay is a time delay between a clock edge that switches an LO signal from low to high, and a rising edge of the LO signal. A falling edge delay is a time delay between a clock edge that switches an LO signal from high to low, and a falling edge of the LO signal.

The rising edge delay and the falling edge delay of the LO signals lo_in3 418, lo_qn3 420, lo_ip3 422, lo_qp3 424 are equal. The equal rising edge delay and falling edge delay result in an increased accuracy of the duty cycle of the divide-by-2 circuit 400 compared with the prior art divide-by-2 circuit 300.

The rising edge delays and the falling edge delays are equal, because compared with the prior art, each of the transistors PM1, PM4, PM5, PM8, NM5, NM10 are coupled directly to one of the clock signals CLKP3 414, CLKN3 416.

A transistor with a switching operation that is controlled by a clock signal received by the transistor, such as the transistors PM1, PM4, PM5, PM8, NM5, NM10, may be referred to as clocked switches or clocked transistors. The clocked switches PM1, PM4, PM5, PM8, NM5, NM10 are arranged to provide a substantially equal falling edge delay and rising edge delay for their respective output sections 406, 408, 410, 412.

In consideration of the first output section 406, the transistors PM1, NM5 are both directly coupled to the clock signal CLKP, and therefore LO signal lo_ip3 422 has equal rising edge delays and falling edge delays. The falling edge delay of the LO signal lo_ip3 422 is controlled by the operation of the transistor NM5 and the rising edge delay of the LO signal lo_ip3 422 is controlled by operation of the transistor PM1. It will be clear to the skilled person how the rising edge delays and falling edge delays are equal for the remaining output sections 408, 410, 412.

All transistors in the divide-by-2 circuit 400 may be sized to have the same drive strengths as, unlike the prior art, there are no phases where a p-type transistor has to directly overcome an n-type transistor to define the voltage at the output node N3. This contributes to rise and fall times of the LO signals lo_in3 418, lo_qn3 420, lo_ip3 422, lo_qp3 424 being equal and therefore the accuracy of the duty cycle of the LO signals of the divide-by-2 circuit 400 is further improved over the prior art divide-by-2 circuit 300. Additionally, equal drive strengths of the transistors means that the divide-by-2 circuit 400 uses less power due to a reduction in capacitive load when compared to the prior art divide-by-2 circuit 300.

The transistors NM1, NM2, NM6, NM7 may be referred to as data NMOS devices. The transistor NM1 is in series with transistor PM1 and transistor NM5; the transistor NM2 is in series with transistor PM4 and transistor NM5; the transistor NM6 is in series with transistor PM5 and transistor NM10; and transistor NM7 is in series with transistors PM8 and transistor NM10.

The transistors NM3, NM4, NM8, NM9 may be referred to as control switches, control transistors or control NMOS devices and their inclusion ensure that there are no shoot-through currents. Therefore, the divide-by-2 circuit 400 consumes less power than the divide-by-2 circuit 300.

The transistors PM2, PM3, PM6, PM7 may be referred to as control switches, control transistors or control PMOS devices. The transistors PM2, PM3, PM6, PM7, ensure that there are no high impedance nodes in the divide-by-2 circuit 400. Additional parasitic capacitance added by the transistors PM2, PM3, PM6, PM7 is insignificant as they are of minimum size.

The control transistors PM2, PM3, PM6, PM7, NM3, NM4, NM8, NM9 may be referred to as cross coupled transistors in the specific implementation shown by the divide-by-2 circuit 400.

A transistor may be referred to as cross coupled if it receives a first signal at its gate that is 180° out of phase with a second signal at an output of the transistor, for example at its drain. This may, for example, be achieved by a single transistor by passing the second signal through an inverter to produce the first signal. As described previously, each of the latches 402, 404 comprise two output sections. In consideration of a single latch, a transistor implemented in one of the output sections may be referred to as being "cross coupled" as it receives an output signal generated in the other output section. For example, the first latch 402 comprises the first output section 406 and the second output section 408. The transistor PM2 of the first output section 406 is cross coupled because it receives an output signal from the second output section 408, namely LO signal lo_in3.

As before for the divide-by-2 circuit 300, it is useful to consider the operation of a single output section to aid clarity in the description of the operation of the divide-by-2 circuit 400. FIG. 4C shows an output section 432 which may correspond to any of the output sections 406, 408, 410, 412. For example, the divide-by-2 circuit 400 may comprise four output sections of the type shown in FIG. 4C where each of the output sections 406, 408, 410, 412 correspond to the output section 432.

The output section 432 comprises a first p-type transistor PM1-3, a second p-type transistor PM2-3, a first n-type transistor NM1-3, a second n-type transistor NM3-3, and a third n-type transistor NM5-3. The first and second p-type transistors PM1-3, PM2-3 are coupled in parallel and have a first terminal coupled to a supply voltage VDD and a second terminal coupled to an output node N3. The output node N3 is coupled to the first n-type transistor NM1-3 at a first terminal. The first n-type transistor NM1-3 has a second terminal coupled to a first terminal of the second n-type transistor NM3-3. The second n-type transistor NM3-3 has a second terminal coupled to a first terminal of the third n-type transistor NM5-3 which has a second terminal coupled to ground. A gate of the first p-type transistor PM1-3 receives a clock signal CLK3; a gate of the second p-type transistor PM2-3 receives a phase shifted output signal Out_ph3; a gate of the first n-type transistor NM1-3 receives an input signal D3; a gate of the second n-type transistor NM3-3 receives the phase shifted output signal Out-ph3; and a gate of the third n-type transistor NM5-3 receives the clock signal CLK3. The output node N3 outputs the output signal Out3. The transistors PM1-3 and NM5-3 may be referred to as first and second clocked switches, respectively.

The first n-type transistor NM3-3 may be referred to as an input switch, and its switching operation is controlled by the input signal D3.

FIG. 4D shows signal waveforms and transistor states associated with the operation of the output section 432. The gate delays have been omitted in FIG. 4D to aid in the clarity of description. Therefore FIG. 4D is primarily concerned with illustrating the occurrence of shoot through currents and high impedance nodes. However, it will be appreciated that in the physical implementation of the divide-by-2 circuit 400, gate delays will be present, as shown in FIG. 4B.

The following signal waveforms and transistor states are shown: the clock signal CLK3 434; the output signal Out3 436; the phase-shifted output signal Out-ph3 438; the input signal D3 440; the first p-type transistor PM1-3 state 442; the second p-type transistor PM2-3 state 444; the first n-type transistor NM1-3 state 446; the second n-type transistor NM3-3 state 448; and the fifth n-type transistor NM5-3 state 450.

For the transistors, a high state denotes that the transistor is "on" and will allow current flow, and a low state denotes that the transistor is "off" and will not allow current flow. If one of the p-type transistors PM1-3, PM2-3 receives a high signal at its gate, it switches off, and if it receives a low signal it switches on. If one of the n-type transistors NM1-3, NM3-3, NM5-3 receives a high signal at its gate, it switches on, and if it receives a low signal it switches off. The phase-shifted output signal Out-ph3 438 has a 180° phase difference compared with the output signal Out3 436.

Shoot through currents are present when there is a path between the supply voltage VDD and ground. This occurs when at least one of the p-type transistors PM1-3, PM2-3 is on and all of the n-type transistors NM1-3, NM3-3, NM3-5 are on. As can be seen in FIG. 4D there is no point during operation where this condition is met.

By omitting transistor NM3-3, the state 448 would effectively be always on, and shoot through currents would occur at points 452a, 452b. It can therefore be seen that the inclusion of the second n-type transistor NM3-3 and its described operation is used to prevent the occurrence of shoot through currents. In FIG. 4D, at points 452a, 452b the second n-type transistor NM3-3 state 448 is off.

High impedance nodes are present when the output node N3 is not coupled to either of the supply voltage VDD and ground. This occurs when both p-type transistors PM1-3, PM2-3 are off and at least one of the n-type transistors NM1-3, NM3-3, NM3-5 is off.

By omitting transistor PM2-3, the state 444 is effectively always off, and high impedance nodes would occur at points 452a, 452b. It can therefore be seen that the inclusion of the second p-type transistor PM2-3 and its described operation is used to prevent the occurrence of high impedance nodes. In FIG. 4D, at points 452a, 452b the second p-type transistor PM2-3 state 444 is on.

The transistors PM2-3, NM3-3 receive the phase shifted output signal Out-ph3 438 at their gates, and may be referred to as control switches, or control transistors. A switching operation of the transistors PM2-3, NM3-3 is controlled by the phase shifted output signal Out-ph3. The transistors PM2-3 and NM3-3 may be referred to as first and second control switches, respectively.

As seen from the above description, the control switches are configured to prevent the output node N3 being coupled to the supply voltage VDD and ground simultaneously, and to prevent the output node N3 being decoupled from the supply voltage VDD and ground simultaneously. If the output node N3 is coupled to both the supply voltage VDD and ground simultaneously there will be shoot through currents, and if the output node N3 is decoupled from both the supply voltage VDD and ground simultaneously, the output node N3 will be in a high impedance state.

Also, as discussed in the above description, it is possible to implement a single control switch to substantially eliminate one of shoot through currents and a high impedance state. For example, in one embodiment a single control switch may be used to prevent the output node N3 being coupled to the supply voltage VDD and ground simultaneously, thereby eliminating shoot through currents but not eliminating a high impedance node. In another embodiment a single control switch may be used to prevent the output node N3 being decoupled from the supply voltage VDD and ground simultaneously, thereby eliminating a high impedance node, but not eliminating shoot through currents.

As mentioned previously the output section 432 may correspond to the output sections 406, 408, 410, 412. For example, if the output section 432 corresponds to the first output section 406, then the first p-type transistor PM1-3 will correspond to the transistor PM1; the second p-type transistor PM2-3 will correspond to the transistor PM2; the first n-type transistor NM1-3 will correspond to the transistor NM1; the second n-type transistor NM3-3 will correspond to the transistor NM3; the third n-type transistor NM5-3 will correspond to the transistor NM5; the clock signal CLK3 434 will correspond to clock CLKP3 414; the output signal Out3 436 will correspond to the LO signal lo_ip3 422, which is the first digital signal; the input signal D3 440 will correspond to the LO signal lo_qn3 420, which is the third digital signal; and the phase-shifted output signal Out-ph3 438 will correspond to the LO signal lo_in3 418, which is the second digital signal. It will be clear to the skilled person how the output section 432 could be implemented in the other output sections 408, 410, 412 to form the divide-by-2 circuit 400.

Comparison of simulation results between practical implementations of the divide-by-2 circuit 300 of the prior art and the divide-by-2 circuit 400 is shown below:

| Parameter | Divide-by-2 circuit 300 (Prior Art) | Divide-by-2-circuit 400 | Units |
| --- | --- | --- | --- |
| VDD | 1.2 | 1.2 | V |
| Current | 1860 | 330 | uA |
| Input frequency | 5200 | 5200 | MHz |
| Input Amplitude | 700 | 700 | mV-pp-diff |
| Duty-cycle | 69 | 75 | % |
| Rise/fall times | 20/38 | 20/28 | ps |
| Phase noise at 100 kHz offset | −127 | −129 | dBc/Hz |
| IQ mismatch (3-sigma) | 2.1 | 1.5 | degrees |
| Differential mismatch (3-sigma) | 2.7 | 1.5 | degrees |
| Duty-cycle mismatch (3-sigma) | 1 | 1 | % |
| Layout area | 270 | 120 | um2 |

As described previously, it is not necessary to "size" the p-type transistors bigger than the n-type transistors in the divide-by-2 circuit 400, as is typically required to achieve equal drive strengths. Therefore, the p-type transistors may be implemented over a smaller chip area than in the divide-by-2 circuit 300 of the prior art. The layout area presented in the table is an estimate of the improved area due to the reduced transistor sizes.

Each of the output sections shown in FIG. 5 may be coupled together to provide a divide-by-2 circuit capable of generating the four LO signals as previously described.

Figure 5C:
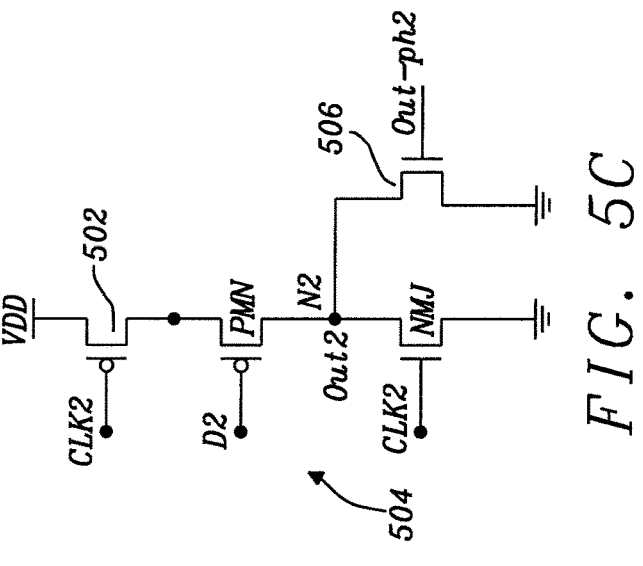
FIG. 5A is a schematic of an output section corresponding to the output section of FIG. 3C, FIGS. 5B, 5C, 5D and 5E are schematics of output sections.
FIG. 5F is a schematic of an output section corresponding to the output section of FIG. 4C in accordance with an embodiment of this disclosure.
FIGS. 5G, 5H, and 5I are schematics of output sections in accordance with embodiments of this disclosure.
Figure 5B:
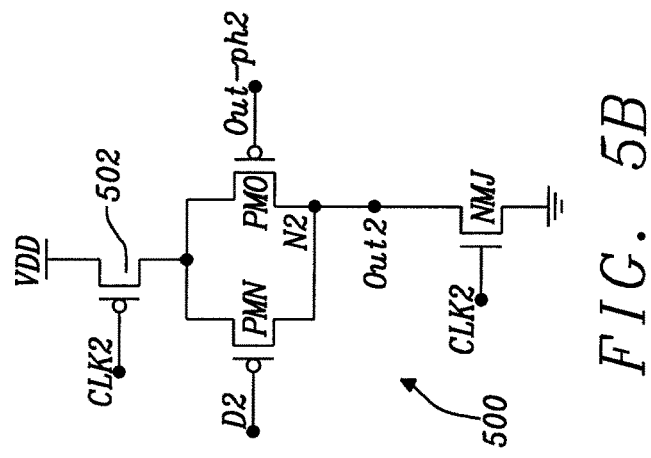
Figure 5A:
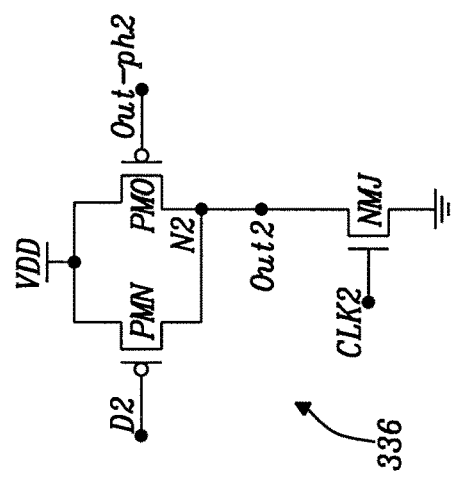

FIG. 5A shows the output section 336 in accordance with the prior art and as described previously. The output section 336 provides a 75% duty cycle. FIG. 5B is a schematic of an output section 500 corresponding to the output section 336 but with the inclusion of a p-type transistor 502 between the parallel pair of the transistors PMN, PMO and the supply voltage VDD. In the output section 500 there is no shoot through current path through the transistors PMN, NMJ or the transistors PMO, NMJ when the clock CLK2 is high due to the inclusion of the p-type transistor 502. As another advantage, now we get same rising edge delays and falling edge delays from the clock CLK2. The duty cycle provided by the output section 500 is 25%. The output section 500 operates like a True Single-Phase Clock (TSPC) gate but here the aim is to reduce power in the latch that the output section 500 is part of. The aim of TSPC circuits is usually to use a single-phase input clock, e.g. CLK2, and therefore reduce power by not needing to convert the single-phase input clock to a differential. The output section 500 has a disadvantage in that the output node N2 is a high impedance node when the input signal D2 344 and the phase-shifted output signal Out-ph2 are high and the CLK2 is low.

FIG. 5C shows an output section 504 derived from the output section 500 designed to avoid the high impedance node at the output node N2. Transistor PMO has been removed and an n-type transistor 506 is coupled in parallel with the transistor NMJ. The n-type transistor 506 receives the phase-shifted output signal Out-ph2 at its gate. Now shoot through currents can occur due to the n-type transistor 506 when the clock CLK2, the input D2 and the output Out2 are all low. The duty cycle provided by the output section 504 is 25%.

Figures 5D, 5E, 5F:
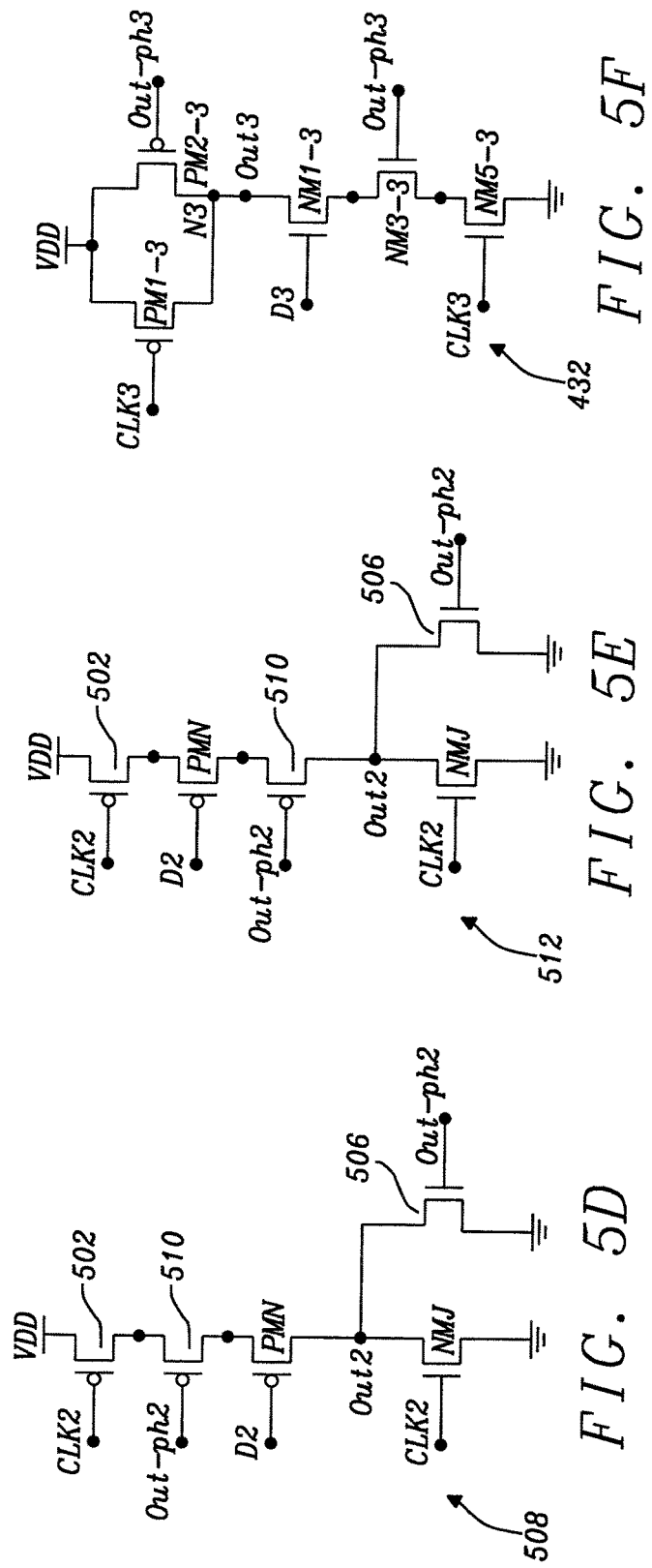

FIG. 5D shows an output section 508 derived from the output section 504 with the inclusion of a p-type transistor 510 in series between the p-type transistor 502 and the transistor PMN. This arrangement limits shoot through currents to very small leakage currents. The duty cycle provided by the output section 508 is 25%.

FIG. 5E shows an output section 512 that is a variation of the output section 508 and achieves the same purpose. The duty cycle provided by the output section 512 is 25%. FIG. 5F is the output section 432 corresponding to the output section 508 where p-type transistors have been swapped with n-type transistors, and n-type transistors have been swapped with p-type transistors to achieve a 75% duty cycle. As described previously, the output signal Out3 may be buffered using an inverter to provide an LO signal with a 25% duty cycle. A further embodiment with the first p-type transistor PM1-3 omitted from the output section 432 will provide a 50% duty cycle.

The divide-by-2 circuit 400 as shown in FIG. 4A comprises four output sections corresponding to the output section 432 as shown in FIG. 4C. However, it will be appreciated that it is possible to construct a divide-by-2 circuit comprising one or more of the output sections 336, 500, 504, 508, 512, 432 in accordance with the understanding of the skilled person. For example, it will be possible to construct a divide-by-2 circuit comprising a combination of different output sections 336, 500, 504, 508, 512, 432.

In a further embodiment, a divider circuit may comprise less than, or more than, four output sections, as will be clear to the skilled person. For example, a divider circuit may comprise a single output section, such as the output section 432, for the generation of a single digital signal; or alternatively, the divider circuit may comprise more than four output sections for the generation of more than four digital signals.

It will be appreciated that the divider circuit is not limited to the generation of digital signals having a duty cycle of 25%, 50% or 75% and a further embodiment may have a duty cycle of any size in accordance with the understanding of the skilled person. For example, it will be possible to achieve a different duty cycle by changing the sizing of the transistors to change the rise and/or fall times, or alternatively by providing an alternative divider circuit topology in accordance with the understanding of the skilled person.

In the output sections 500, 504, 508, 512 432, the issue of duty cycle inaccuracy is resolved by the inclusion of two clocked transistors that receive a clock signal, for example: duty cycle inaccuracy is resolved by the addition to the output section 336 of the p-type transistor 502 that receives the clock signal CLK2, to form the output section 500.

As an additional effect of the inclusion of the p-type transistor 502 in the output section 500, shoot through currents are also eliminated, however it is not essential that shoot through currents are eliminated to resolve the issue of duty cycle inaccuracy. This can be seen in the output section 504, which has an accurate duty cycle due to the p-type transistor 502, but also has exhibits shoot through currents and no high impedance nodes due to the modification to the output section 504 when compared to the output section 500.

As described for the output section 432 above, and for the output sections 500, 504, it is possible to eliminate high impedance nodes and shoot through currents independent of each other. It is also possible to eliminate each of shoot through currents and high impedance nodes independent of providing an accurate duty cycle using the two clocked transistors.

FIG. 5G is a schematic of an output section 514 in accordance with an embodiment of this disclosure, corresponding to the output section 336 but with the inclusion of an n-type transistor 515 configured to receive the output signal Out-ph2 at its gate, and coupled in parallel with the transistor NMJ. The output section 514 substantially eliminates the high impedance nodes but does not provide the accurate duty cycle and does not eliminate shoot through currents.

FIG. 5H is a schematic of an output section 516 in accordance with an embodiment of this disclosure, corresponding to the output section 336 but with the inclusion of an n-type transistor 517 configured to receive the output signal Out-ph2 at its gate and coupled in series between the transistor NMJ and the output node N2. The output section 516 substantially eliminates the shoot through currents but does not provide the accurate duty cycle and does not eliminate the high impedance nodes.

FIG. 5I is a schematic of an output section 518 that combines both of the output section 514 and the output section 516, and is in accordance with an embodiment of this disclosure. The transistor 517 is coupled in series with transistor NMJ and the output node N2; and the transistor 515 is coupled in parallel with the series coupling of the transistor NMJ and the transistor 517. In the output section 518, the transistor 515 may be of a sufficiently small size to substantially eliminate the occurrence of shoot through currents through the transistor 515. Therefore, output section 518 substantially eliminates both the shoot through currents and the high impedance nodes, but does not provide an accurate duty cycle.

It will be appreciated that the transistors 515, 517 may be referred to as control switches or control transistors, as previously defined, and the transistors 515, 517 may be cross coupled.

Various improvements and modifications may be made to the above without departing from the scope of the disclosure.

What is claimed is:

1. A divider circuit for generating one or more digital signals, comprising a first output section, the first output section for generating a first digital signal, the first output section comprising:
   an output node configured to output the first digital signal; and
   a plurality of switches comprising one or more control switches; wherein:
   the plurality of switches are configured to selectively couple the output node to a first voltage and/or to selectively couple the output node to a second voltage, thereby generating the first digital signal; and
   the, or each, control switch is configured to prevent the output node being coupled to the first and second voltages simultaneously.

2. The divider circuit of claim 1, wherein:
   the plurality of switches comprises one or more clocked switches, a switching operation of the, or each, clocked switch being controlled by a clock signal received by the, or each, clocked switch; and
   the switching operation of the, or each, clocked switch contributes to at least one of the selective coupling of the output node to the first voltage and to the selective coupling of the output node to the second voltage.

3. The divider circuit of claim 2, wherein:
   a clock edge is a rising or falling edge of the clock signal;
   a falling edge delay is a time delay between a clock edge that switches the first digital signal from the first voltage to the second voltage and a falling edge of the first digital signal;
   a rising edge delay is a time delay between a clock edge that switches the first digital signal from the second voltage to the first voltage and a rising edge of the first digital signal; and
   the one or more clocked switches are arranged to provide a substantially equal falling edge delay and rising edge delay.

4. The divider circuit of claim 2, wherein the one or more clocked switches comprise a first and second clocked switch.

5. The divider circuit of claim 1, wherein:
   a switching operation of the, or each, control switch is controlled by a second digital signal received by the, or each, control switch;
   the switching operation of the, or each, control switch contributes to at least one of the selective coupling of the output node to the first voltage and to the selective coupling of the output node to the second voltage; and
   the switching operation of the, or each, control switch prevents the output node being coupled to the first and second voltage simultaneously.

6. The divider circuit of claim 5 wherein the second digital signal has an approximately 180° phase difference compared with the first digital signal.

7. The divider circuit of claim 5, comprising a first latch, the first latch comprising the first output section and a second output section, the second output section arranged to generate the second digital signal and to provide the second digital signal to the first output section.

8. The divider circuit of claim 1, wherein:
   the one or more control switches comprise a first control switch;
   the first control switch is arranged to prevent the output node from being coupled to both the first and second voltages simultaneously.

9. The divider circuit of claim 1, wherein the plurality of switches comprises:
   an input switch, a switching operation of the input switch being controlled by a third digital signal received by the input switch; and
   the switching operation of the first input switch contributes to at least one of the selective coupling of the output node to the first voltage and to the selective coupling of the output node to the second voltage.

10. The divider circuit of claim 9, wherein the third digital signal has an approximately 90° phase difference compared with the first digital signal.

11. The divider circuit of claim 9, comprising a first latch and a second latch, the first latch comprising the first output section and the second latch comprising a third output section, the third output section arranged to generate the third digital signal and to provide the third digital signal to the first output section.

12. The divider circuit of claim 8, wherein:
the plurality of switches comprises one or more clocked switches, a switching operation of the, or each, clocked switch being controlled by a clock signal received by the, or each, clocked switch; and
the switching operation of the, or each, clocked switch contributes to at least one of the selective coupling of the output node to the first voltage and to the selective coupling of the output node to the second voltage.

13. The divider circuit of claim 12, wherein:
the one or more clocked switches comprises a first clocked switch and a second clocked switch;
the first clocked switch is arranged to contribute to the selective coupling of the output node to the first voltage; and
the second clocked switch is arranged to contribute to the selective coupling of the output node to the second voltage.

14. The divider circuit of claim 13, wherein the first clocked switch and the first control switch are coupled in parallel.

15. The divider circuit of claim 13, wherein the second clocked switch and the second control switch are coupled in series.

16. The divider circuit of claim 1, wherein the switches are transistors.

17. The divider circuit of claim 1 for generating the first, a second, a third and a fourth digital signal, wherein the four digital signals are in quadrature, the divider circuit comprising:
a first latch comprising the first output section and a second output section;
a second latch comprising a third output section and a fourth output section;
the first latch and second latch coupled together; and
the second, third and fourth output sections are arranged to generate the second digital signal, the third digital signal and the fourth digital signal, respectively.

18. The divider of circuit of claim 1, wherein the, or each, digital signal has a duty cycle of 25%, 50% or 75%.

19. The divider circuit of claim 1, wherein the, or each, control switch is cross coupled.

20. The divider circuit of claim 1, wherein the, or each, control switch is configured to prevent the output node being decoupled from both the first and second voltages simultaneously.

21. The divider circuit of claim 20, wherein:
a switching operation of the, or each, control switch is controlled by a second digital signal received by the, or each, control switch;
the switching operation of the, or each, control switch contributes to at least one of the selective coupling of the output node to the first voltage and to the selective coupling of the output node to the second voltage; and
the switching operation of the, or each, control switch prevents at least one of the output node being coupled to the first and second voltage simultaneously and the output node being decoupled from both the first and second voltages simultaneously.

22. The divider circuit of claim 20, wherein:
the one or more control switches comprise a first control switch and a second control switch;
the first control switch is arranged to prevent the output node from being decoupled from both the first and second voltages simultaneously; and
the second control switch is arranged to prevent the output node from being coupled to both the first and second voltages simultaneously.

23. A method for generating one or more digital signals using a divider circuit, comprising a first output section, the first output section for generating a first digital signal, the first output section comprising:
an output node configured to output the first digital signal; and
a plurality of switches comprising one or more control switches; the method comprising:
selectively coupling the output node to a first voltage and/or selectively coupling the output node to a second voltage using the plurality of switches, thereby generating the first digital signal; and
preventing the output node being coupled to the first and second voltages simultaneously, the, or each, control switch.

24. The method of claim 23 comprising preventing the output node being decoupled from both the first and second voltages simultaneously, using the, or each, control switch.

* * * * *